US007375596B2

(12) United States Patent
Park et al.

(10) Patent No.: US 7,375,596 B2
(45) Date of Patent: May 20, 2008

(54) QUADRATURE VOLTAGE CONTROLLED OSCILLATOR

(75) Inventors: Jin-soo Park, Yongin-si (KR); Chan-young Jeong, Suwon-si (KR); Chang-sik Yoo, Bucheon-si (KR); Seong-soo Lee, Suwon-si (KR); Heung-bae Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 97 days.

(21) Appl. No.: 11/348,229

(22) Filed: Feb. 7, 2006

(65) Prior Publication Data

US 2006/0181356 A1 Aug. 17, 2006

(30) Foreign Application Priority Data

Feb. 14, 2005 (KR) ..................... 10-2005-0012083

(51) Int. Cl.
*H03B 5/00* (2006.01)

(52) U.S. Cl. ....................... 331/45; 331/46; 331/113 R

(58) Field of Classification Search .................. 331/45, 331/46, 113 R
See application file for complete search history.

(56) References Cited

U.S. PATENT DOCUMENTS 6,456,167 B1 * 9/2002 Huang ......................... 331/46

FOREIGN PATENT DOCUMENTS

KR 10-2004-0077304 A 9/2004

OTHER PUBLICATIONS

Kassin, Ahmed. K.: "Tail Current Flicker Noise Reducation in LC VCO's by Complementary Switched Biasing", Mentor Graphics, Ain Shams University, Dec. 9-11, 2003, pp. 105, Cairo, Egypt.

* cited by examiner

*Primary Examiner*—Joseph Chang
(74) *Attorney, Agent, or Firm*—Sughrue Mion, PLLC

(57) ABSTRACT

A quadrature voltage controlled oscillator having low phase noise and excellent output swing characteristics includes a first voltage controlled oscillator for outputting a positive in-phase output signal and a negative in-phase output signal; a second voltage controlled oscillator for outputting a positive quadrature-phase output signal and a negative quadrature-phase output signal, the second voltage controlled oscillator having a symmetrical structure with the first voltage controlled oscillator and constituting a feedback loop together with the first voltage controlled oscillator; a first constant current source for supplying constant current to the first voltage controlled oscillator in response to the output signals; and a second constant current source for supplying constant current to the second voltage controlled oscillator in response to the output signals.

13 Claims, 7 Drawing Sheets

QUADRATURE VOLTAGE CONTROLLED OSCILLATOR

This application claims priority from Korean Patent Application No. 2005-12083, filed on Feb. 14, 2005, the entire content of which is incorporated herein by reference.

BACKGROUND OF THE INVENTION

1. Field of the Invention

The present invention relates to a quadrature voltage controlled oscillator, and more particularly to a quadrature voltage controlled oscillator having low phase noise and excellent output swing characteristics.

2. Description of the Related Art

A quadrature oscillator outputs four signals having different phases. The quadrature oscillator is generally used in a transceiver circuit for communication devices such as cellular phones, wireless telephones, wireless networking devices, and blue-tooth communication devices.

The above-described devices use a direct conversion method or a low-intermediate frequency method rather than a super heterodyne method to convert a radio frequency (RF) signal to a baseband signal. This is because the direct conversion manner or the low-intermediate frequency manner is advantageous over the super-heterodyne manner in terms of cost and integration. Accordingly, there is a need for a quadrature voltage controlled oscillator capable of generating in-phase output signals and quadrature-phase output signals.

FIG. 1 is a schematic circuit diagram of a conventional quadrature voltage controlled oscillator (VCO). Referring to FIG. 1, the quadrature VCO is composed of two VCOs having the same structure and constituting a feedback structure. This conventional quadrature VCO is disclosed in U.S. Pat. No. 6,462,626 entitled "Quadrature Output Oscillator," issued on Oct. 8, 2002. U.S. Pat. No. 6,462,626 is hereby incorporated in its entirety by reference.

One of the two VCOs as described above outputs a positive in-phase signal and a negative in-phase signal and the other VCO outputs a negative quadrature-phase signal and a positive quadrature-phase signal. Each of the two VCOs comprises a constant current source (i.e., NMOS transistor biased by a Vbias voltage) for supplying constant current.

However, continuous operation of the NMOS transistor in a saturation region causes a flicker noise to increase, which in turn causes a phase noise to increase. The flicker noise is caused by a phenomenon that electrons passing a channel of the transistor are captured by the gate of the NMOS transistor through which constant current continues to flow.

Further, in the left VCO of FIG. 1, the minimum point of a voltage swing of the output voltages IP and IN and the minimum point of a voltage at the drain of the NMOS transistor biased by the Vbias voltage are not aligned to each other, and thus the voltage swing of the output voltages IP and IN is limited. Similarly, in the right VCO, the minimum point of a voltage swing of the output voltages QN and QP and the minimum point of a voltage at the drain of the NMOS transistor biased by the Vbias voltage are not aligned to each other, and thus the voltage swing of the output voltages QN and QP is limited.

SUMMARY OF THE INVENTION

An aspect of the present invention is to provide a quadrature voltage controlled oscillator having a low phase noise characteristic.

Another aspect of the present invention is to provide a quadrature voltage controlled oscillator having an excellent output swing characteristic.

According to an aspect of the present invention, there is provided a quadrature voltage controlled oscillator, according to an exemplary embodiment of the present invention, which comprises a first voltage controlled oscillator for outputting a positive in-phase output signal and a negative in-phase output signal; a second voltage controlled oscillator for outputting a positive quadrature-phase output signal and a negative quadrature-phase output signal, the second voltage controlled oscillator having a symmetrical structure with the first voltage controlled oscillator and constituting a feedback loop together with the first voltage controlled oscillator; a first constant current source for supplying constant current to the first voltage controlled oscillator in response to the output signals; and a second constant current source for supplying constant current to the second voltage controlled oscillator in response to the output signals.

The first current source may supply the constant current in response to the positive in-phase output signal and the negative in-phase output signal.

The first current source may include two NMOS transistors, and the positive in-phase output signal and the negative in-phase output signal may be input to gates of the NMOS transistors, respectively.

The second current source may supply the constant current in response to the positive quadrature-phase output signal and the negative quadrature-phase output signal.

The second current source may include two NMOS transistors, and the positive quadrature-phase output signal and the negative quadrature-phase output signal may be input to gates of the NMOS transistors, respectively.

The first current source may supply the constant current in response to the positive quadrature-phase output signal and the negative quadrature-phase output signal.

The first current source may include two NMOS transistors, and the positive quadrature-phase output signal and the negative quadrature-phase output signal may be input to gates of the NMOS transistors, respectively.

The second current source may supply the constant current in response to the positive in-phase output signal and the negative in-phase output signal.

The second current source may include two NMOS transistors, and the positive in-phase output signal and the negative in-phase output signal may be input to gates of the NMOS transistors, respectively.

BRIEF DESCRIPTION OF THE DRAWINGS

The above and/or other aspects of the present invention will be more apparent by describing certain exemplary embodiments of the present invention with reference to the accompanying drawings, in which.

DETAILED DESCRIPTION OF EXEMPLARY EMBODIMENTS

Figure 1:
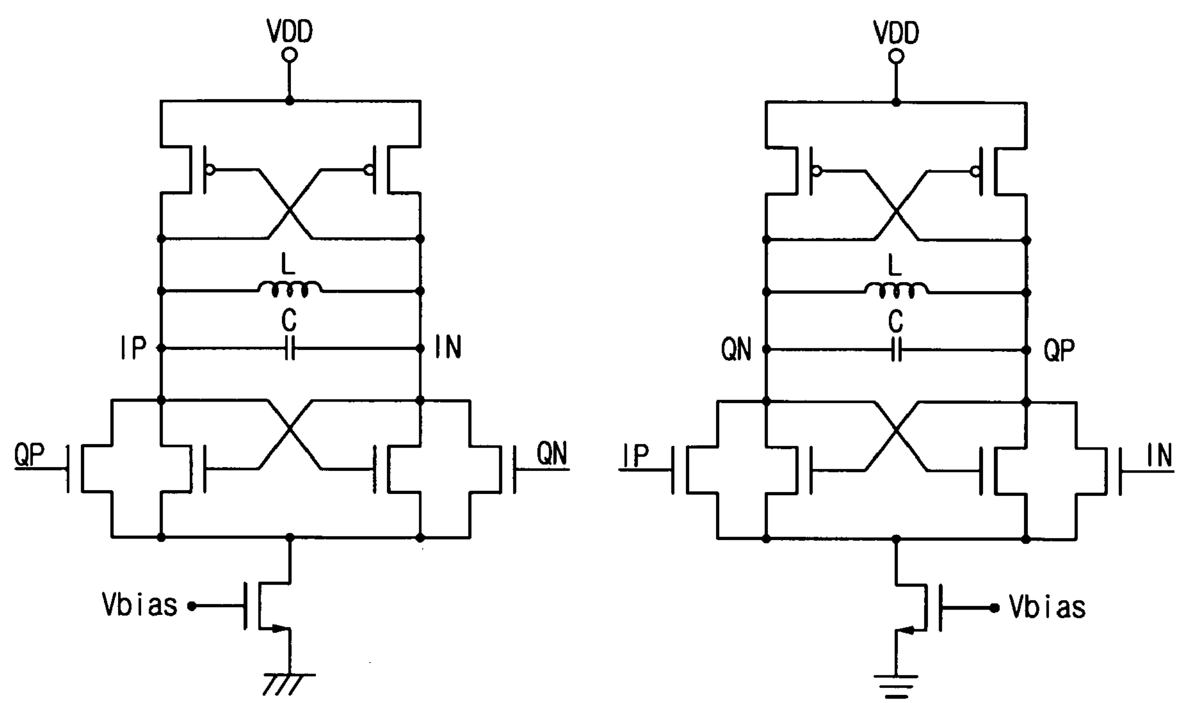
FIG. 1 is a schematic circuit diagram of a conventional quadrature voltage controlled oscillator.

Certain exemplary embodiments of the present invention will be described in greater detail with reference to the accompanying drawings.

In the following description, same drawing reference numerals are used for the same elements even in different drawings. The matters defined in the following description, such as a detailed construction and elements, are provided to assist in a comprehensive understanding of the invention, and only refer to exemplary embodiments of the present invention. Thus, it is apparent that the present invention can be carried out without those defined matters. Also, well-known functions or constructions are not described in detail since they would obscure the invention in unnecessary detail.

Figure 2:
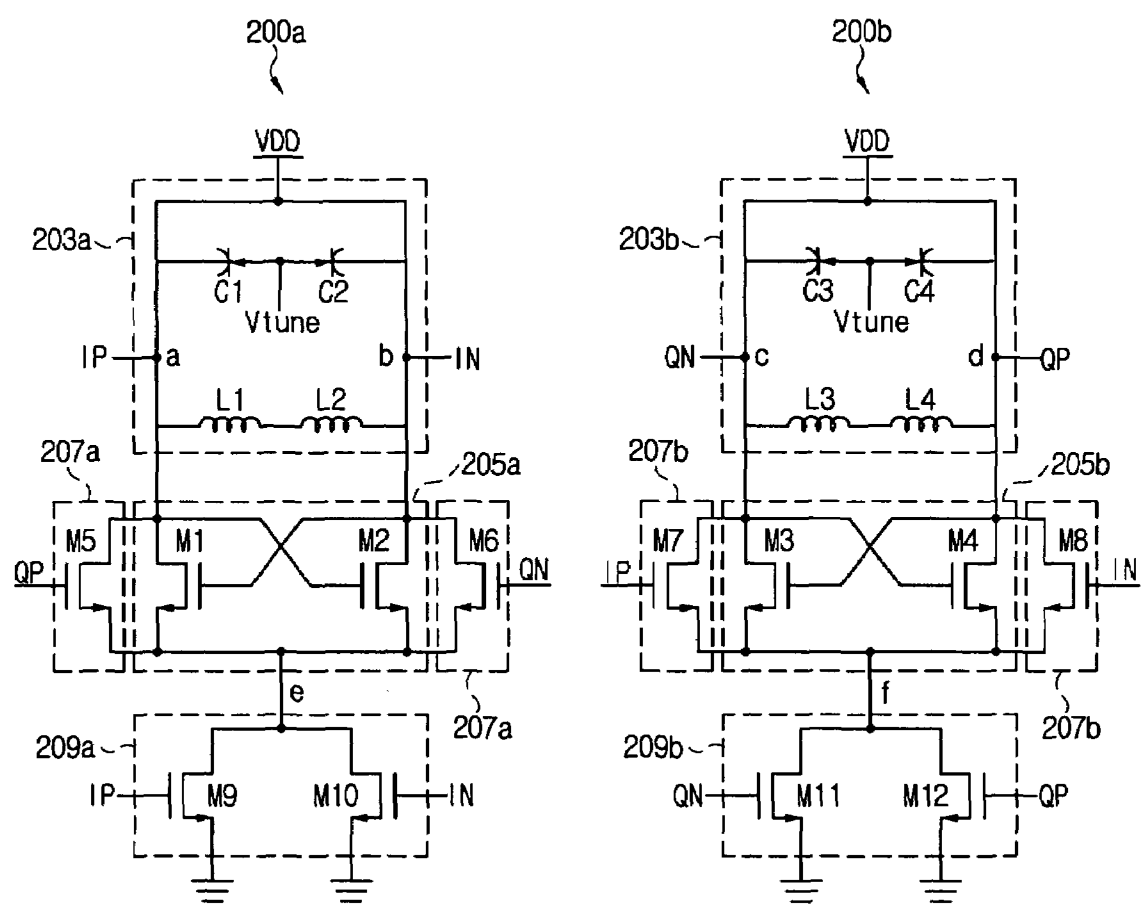
FIG. 2 is a schematic circuit diagram of a quadrature voltage controlled oscillator according to an exemplary embodiment of the present invention.

FIG. 2 is a schematic circuit diagram of a quadrature voltage controlled oscillator (VCO) according to an exemplary embodiment of the present invention.

In FIG. 2, the quadrature VCO is composed of two symmetrical VCOs 200*a* and 200*b*.

The VCO 200*a* includes an inductance-capacitance (LC) circuit 203*a*, a negative resistance part 205*a*, a coupling circuit part 207*a* that couples between the two VCOs 200*a* and 200*b*, and a constant current source 209*a*.

Similarly, the other VCO 200*b* includes an LC circuit 203*b*, a negative resistance part 205*b*, a coupling circuit part 207*b* that couples between the two VCOs 200*a* and 200*b*, and a constant current source 209*b*.

In this exemplary embodiment, the VCO 200*a* generates two output signals, e.g., a positive in-phase output signal IP and a negative in-phase output signal IN, and the other VCO 200*b* outputs two output signals, i.e., a positive quadrature-phase output signal QP and a negative quadrature-phase output signal QN. The VCO 200*a* and the VCO 200*b* have a symmetrical structure and are interconnected to constitute a feedback loop.

The LC circuit 203*a* of the VCO 200*a* is composed of inductors L1 and L2 and capacitors C1 and C2 for determining frequencies of the in-phase output signals IP and IN. Variation of inductance or capacitance of the LC circuit 203*a* may lead to a change in the frequency (i.e., resonance frequency) of the output signals. In this exemplary embodiment, the capacitors C1 and C2 are varactors having voltage-dependent capacitance.

Alternatively, the resonance frequency may be changed by adjusting the inductance of the LC circuit 203*a*.

When the LC circuit 203*a* is ideal, a steady state voltage generated by the LC circuit 203*a* is perpetually oscillated. However, an actual LC circuit 203*a* has positive resistance (not shown) existing in the inductors L1 and L2 and the capacitors C1 and C2. Accordingly, the LC circuit 203*a* has an output voltage exhibiting a response characteristic of an RLC circuit. That is, the output voltage is damping-oscillated.

The negative resistance part 205*a* provides negative resistance that cancels out the positive resistance of the above-described LC circuit 203*a*. In the exemplary embodiment, the coupling circuit 207*a*, which will be described later, may also contribute to the provision of the negative resistance. The LC circuit 203*a*, the negative resistance part 205*a* and the coupling circuit 207*a* constitute an ideal LC circuit.

In this exemplary embodiment, the negative resistance part 205*a* is composed of two N-channel Metal Oxide Semiconductor (NMOS) transistors M1 and M2 that are connected to each other. As shown, the negative in-phase output signal is input to the gate of the M1 transistor and the positive in-phase output signal is input to the gate of the M2 transistor.

The coupling circuit 207*a* is composed of two NMOS transistors M5 and M6, coupling between the two VCOs 200*a* and 200*b*. That is, the positive quadrature-phase output signal QP from the other VCO 200*b* is input to the gate of the M5 transistor and the negative quadrature-phase output signal QN from the other VCO 200*b* is input to the gate of the M6 transistor.

In this exemplary embodiment, the constant current source 209*a* is composed of NMOS transistors M9 and M10 for supplying constant current to the VCO 200*a*. In the constant current source 209*a*, the positive in-phase output signal IP is input to the gate of the M9 transistor and the negative in-phase output signal IN is input to the gate of the M10 transistor. Accordingly, if the M9 transistor is turned off, the M10 transistor is turned on and if the M10 transistor is turned off, the M9 transistor is turned on, allowing constant current to be supplied. Periodically turning on and off the M9 transistor and the M10 transistor reduces the flicker noise, which in turn reduces the phase noise.

The function of the other VCO 200*b* will be now described. The LC circuit 203*b*, the negative resistance part 205*b*, the coupling circuit 207*b* and the constant current source 209*b* have similar structures as those of the above-described VCO 200*a*, and accordingly only different portions from the VCO 200*a* will be described.

In the VCO 200*b*, the positive in-phase signal IP is input to the gate of the M7 transistor in the coupling circuit 207*b* and the negative in-phase signal IN is input to the gate of the M8 transistor. The negative quadrature-phase signal QN is input to the gate of the M11 transistor in the constant current source 209*b*, and the positive quadrature-phase signal QP is input to the gate of the M12 transistor. The VCO 200*a* and the VCO 200*b* constitute a feedback structure.

The constant current source, 209*b* may supply constant current to the VCO 200*b* in response to the quadrature-phase output signals, similarly to the constant current source 209*a*.

Figure 3:
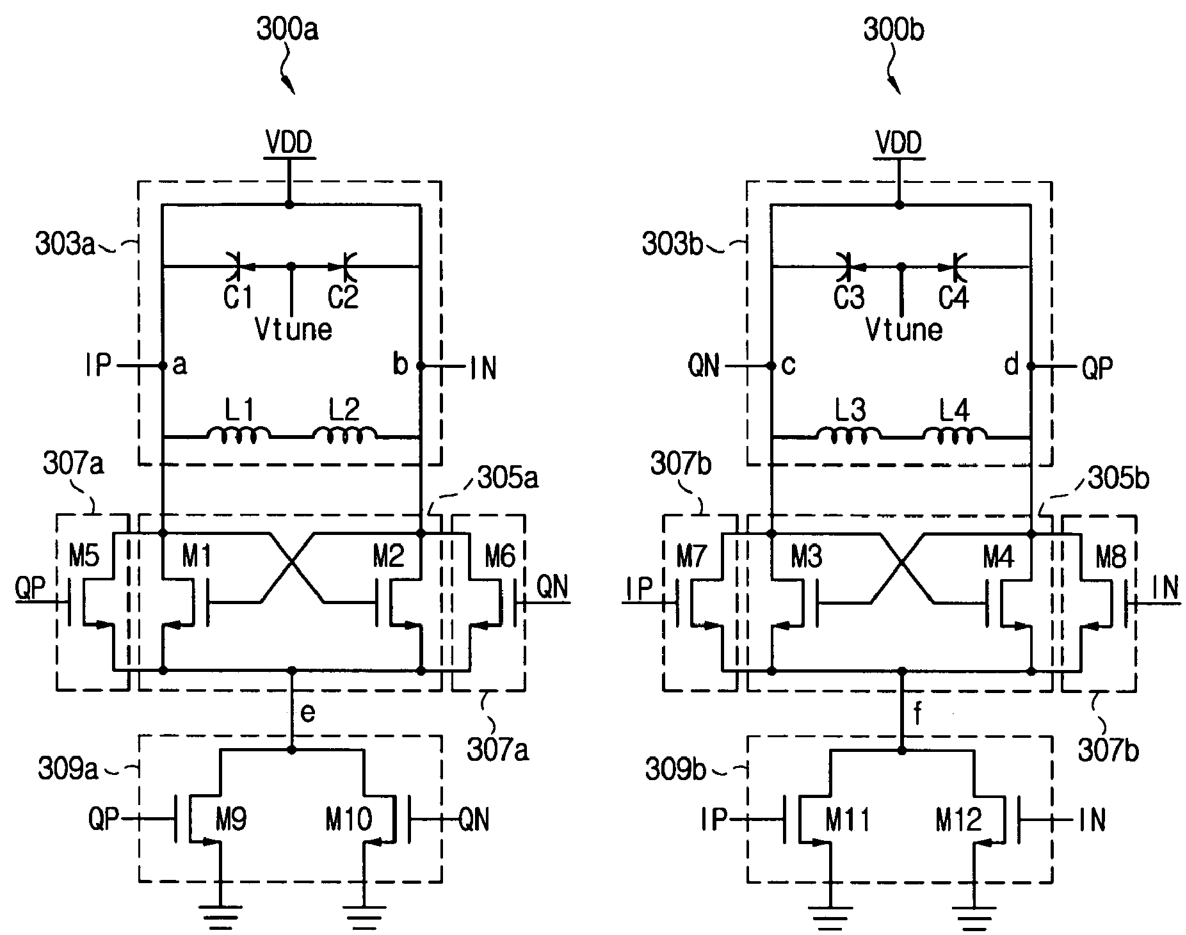
FIG. 3 is a schematic circuit diagram of a quadrature voltage controlled oscillator according to another exemplary embodiment of the present invention.

FIG. 3 is a schematic circuit diagram of a quadrature voltage controlled oscillator according to another exemplary embodiment of the present invention.

The quadrature VCO of FIG. 3 has the same structure as that of FIG. 2 except for constant current sources 309*a* and 309*b*.

The constant current source 309*a* supplies constant current to the VCO 300*a* in response to the quadrature-phase output signals QP and QN, unlike the constant current source 209*a* of FIG. 2. The constant current source 309*b* supplies constant current to the VCO 300*b* in response to the in-phase output signals IP and IN, unlike the constant current source 209*b* of FIG. 2.

With the configuration as shown in FIG. 3, the minimum point of a swing of the in-phase output voltage signals IP and IN and the minimum point of a voltage swing at a node e are aligned to each other, and the minimum point of a swing the quadrature-phase output voltage signals QP and QN and the minimum point of a voltage swing at a node f are aligned to each other. As a result, the output signals have a larger swing width than that in the exemplary embodiment of FIG. 2. Further, since the phase noise of the VCO is inversely proportional to the width of the output signal, it is further reduced.

Figure 4:
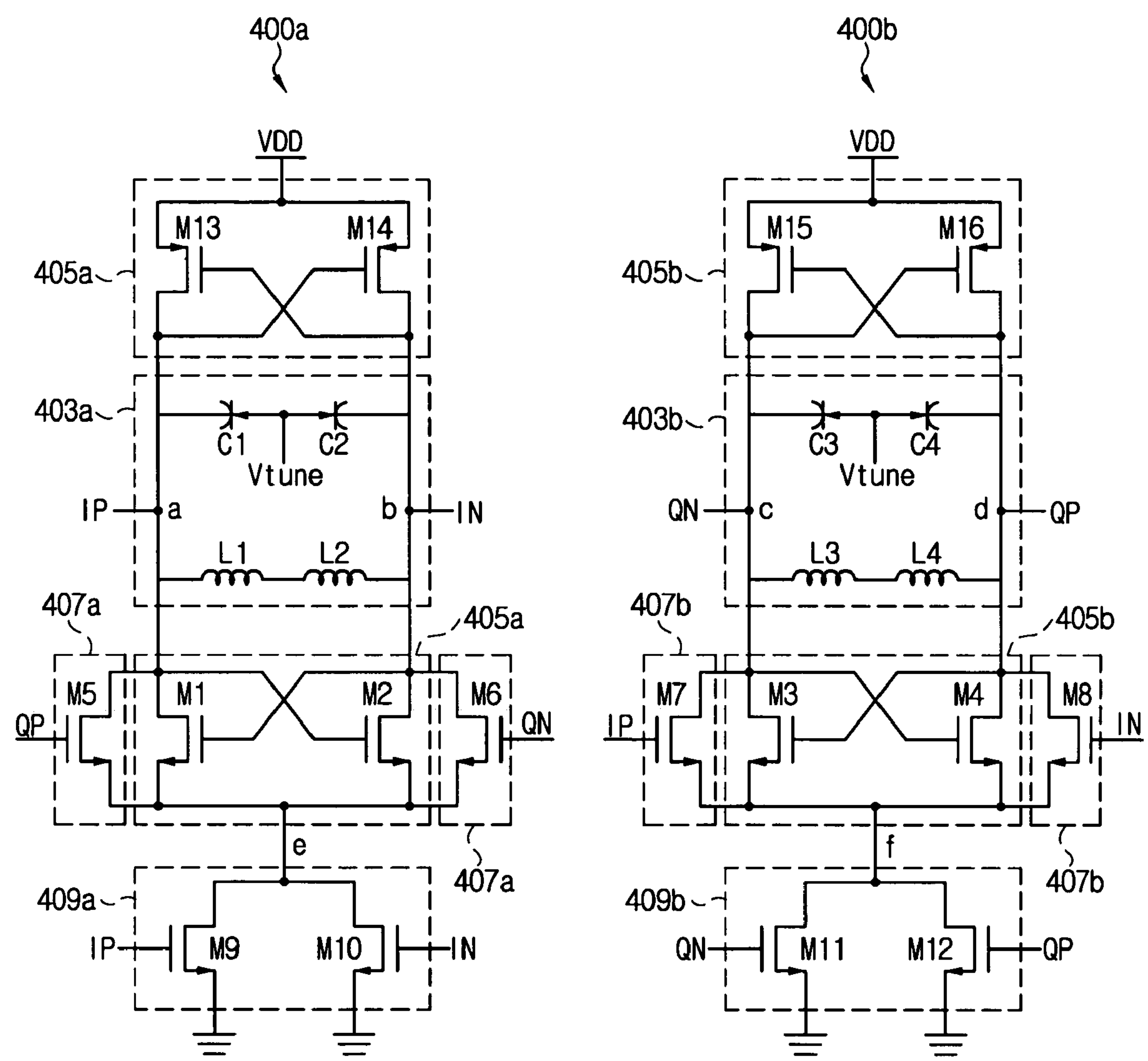
FIG. 4 is a schematic circuit diagram of a quadrature voltage controlled oscillator according to still another exemplary embodiment of the present invention.

FIG. 4 is a schematic circuit diagram of a quadrature voltage controlled oscillator according to still another exemplary embodiment of the present invention.

The quadrature VCO of FIG. 4 has the same structure as that of the quadrature VCO of FIG. 2 except for negative resistance parts 405*a* and 405*b*.

The negative resistance part 405*a* is composed of two PMOS transistors M13 and M14 (which forms an "N-channel" part) and two NMOS transistors M1 and M2 (which forms a "P-channel" part), unlike the negative resistance part 205*a* of FIG. 2. The negative resistance part 405*b* is composed of a P-channel part having two PMOS transistors M15 and M16 and an N-channel part having two NMOS transistors M3 and M4.

With a push-pull configuration having the N-channel and P-channel parts, it is possible to obtain a larger output voltage swing width using a lower power supply voltage, like the configuration shown in FIG. 4. That is, with respect to the same power supply voltage, the output voltages IP, IN, QP and QN of FIG. 4 have a swing width greater than that of the output voltages IP, IN, QP and QN of FIG. 2.

Figure 5:
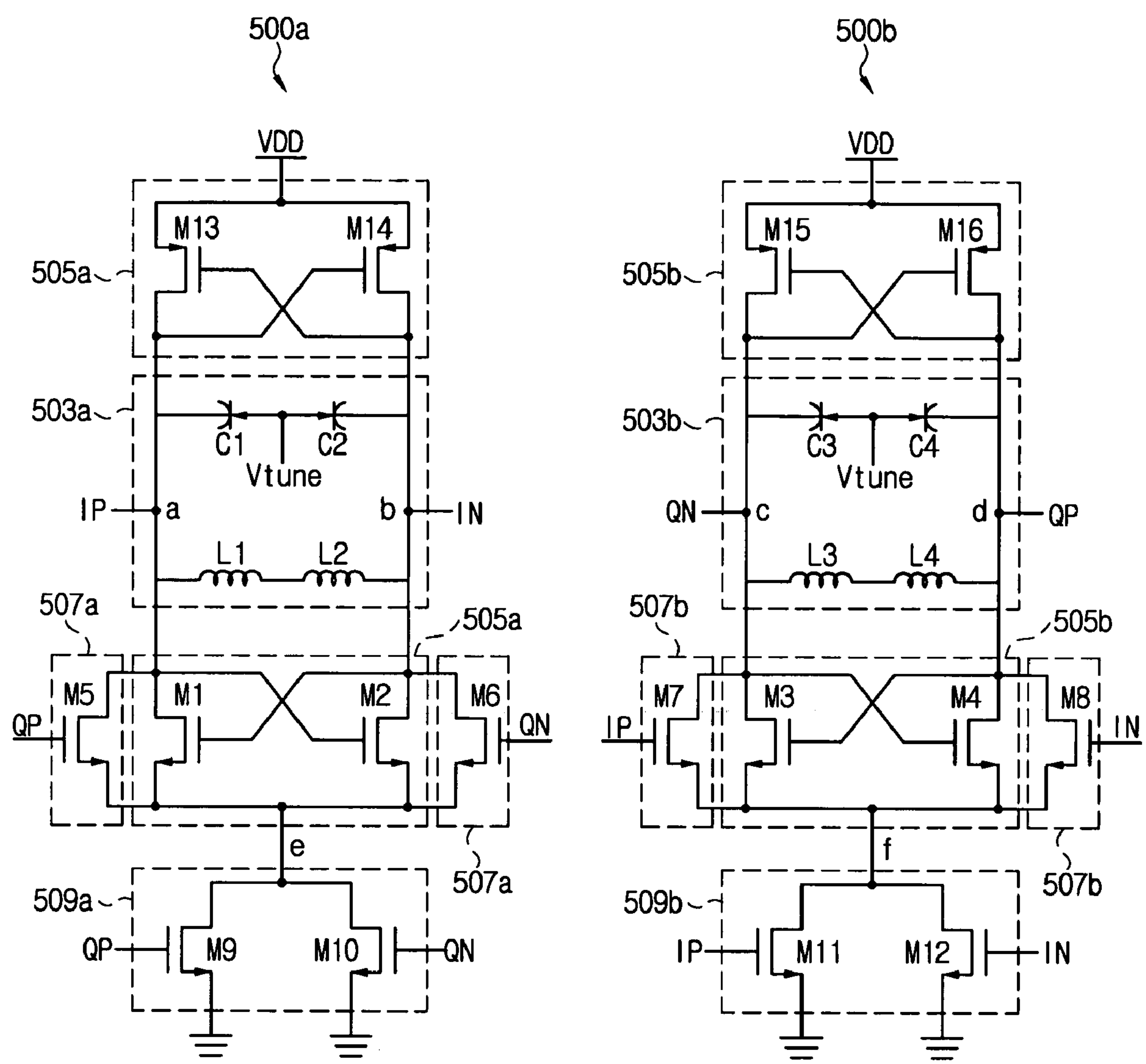
FIG. 5 is a schematic circuit diagram of a quadrature voltage controlled oscillator according to still another exemplary embodiment of the present invention.

FIG. 5 is a schematic circuit diagram of a quadrature voltage controlled oscillator according to yet another exemplary embodiment of the present invention.

The quadrature VCO of FIG. 5 has the same structure as that of FIG. 4 except for constant current sources 509*a* and 509*b*.

The constant current source 509*a* supplies constant current to the VCO 500*a* in response to the quadrature-phase output signals QP and QN, unlike the constant current source 409*a* of FIG. 4. Similarly, the constant current source 509*b* supplies constant current to the VCO 500*b* in response to the in-phase phase output signals IP and IN, unlike the constant current source 409*b* of FIG. 4.

With the configuration as shown in FIG. 5, a minimum point of a swing of the in-phase output voltage signals IP and IN and a minimum point of a swing of a voltage at a node e are aligned to each other, and a minimum point of the swing of the quadrature-phase output voltage signals QP and QN and a minimum point of the swing of the voltage at the node f are aligned to each other. As a result, the swing width of output signals becomes greater than that in the exemplary embodiment of FIG. 4. Further, the quadrature VCO in FIG. 5 has power consumption (for example, 1.8V, 4 mA) less than that of the quadrature VCO in FIG. 4.

Figure 6:
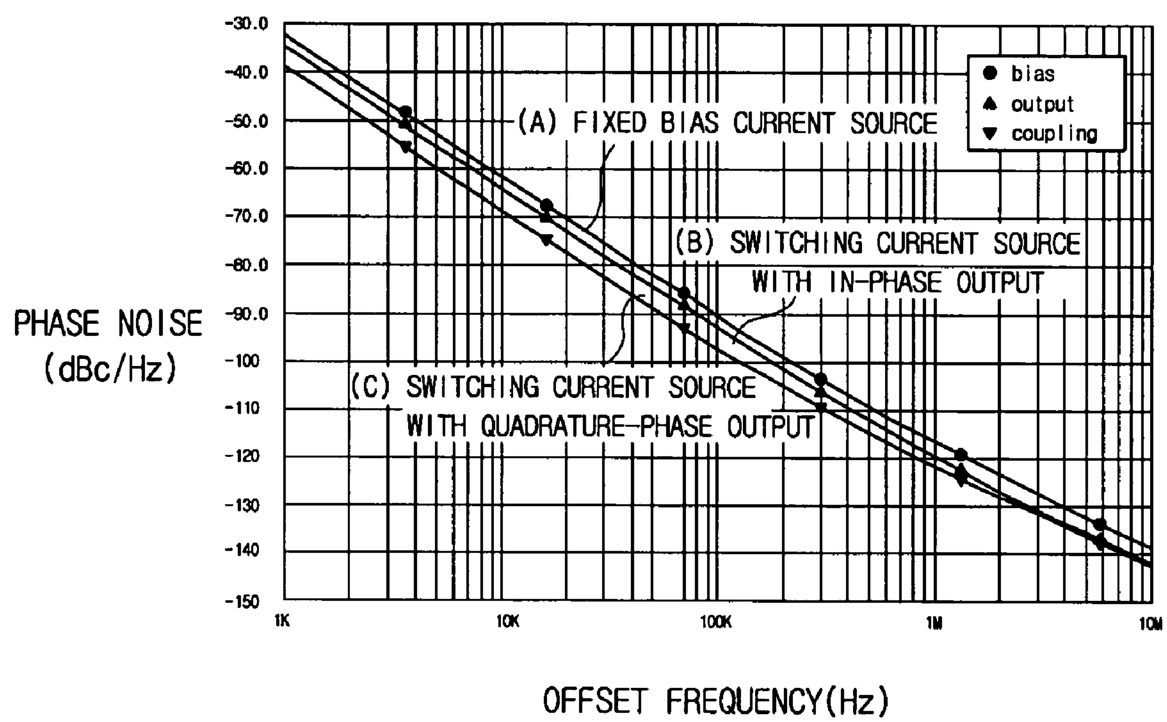
FIG. 6 is a comparative diagram of characteristic curves of phase noises in the conventional quadrature voltage controlled oscillator and in the quadrature voltage controlled oscillators of FIGS. 4 and 5.

FIG. 6 is a comparative diagram of characteristic curves of phase noise of the conventional quadrature voltage controlled oscillator and the quadrature voltage controlled oscillators of FIGS. 4 and 5.

In FIG. 6, line A indicates phase noise of the conventional VCO of FIG. 1, line B indicates phase noise of the VCO of FIG. 4, and line C indicates phase noise of the VCO of FIG. 5. The horizontal axis indicates an offset frequency representing a spacing from the central frequency, and the vertical axis indicates the size of power at the offset frequency. The power at the offset frequency has a value indicated in the case where the size of the power at the central frequency is referenced to 0 dB. Accordingly, the size of the phase noise becomes smaller as a value on the vertical axis is lowered.

It can be seen from FIG. 6 that the phase noise in the VCO of FIG. 4 is 2 to 3 dB lower than that of the conventional VCO at the offset frequency of about 100 KHz, and the phase noise in the VCO of FIG. 5 is 7 to 8 dB lower than the phase noise of the conventional VCO. Similarly, it can be seen that the phase noise is reduced even at offset frequencies of 1 KHz and 10 KHz which are close to the central frequency.

Figure 7A:
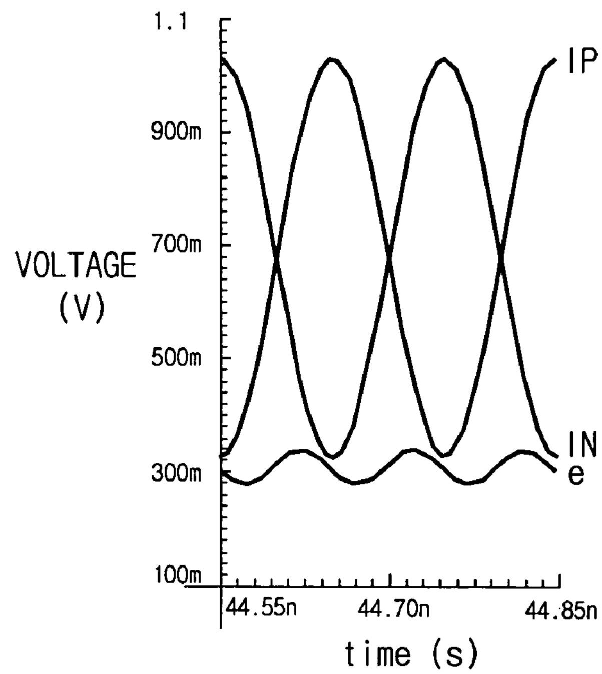
FIG. 7A is a graph illustrating a waveform produced by the quadrature voltage controlled oscillator of FIG. 4.
Figure 7B:
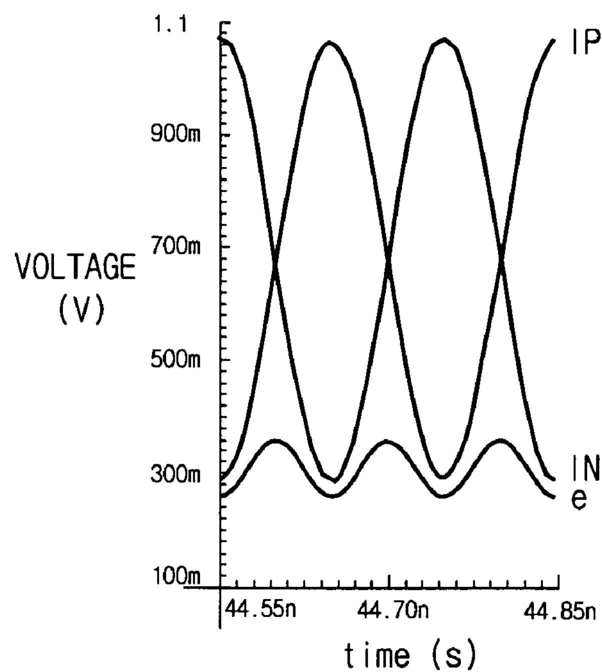
FIG. 7B is a graph illustrating a waveform produced by the quadrature voltage controlled oscillator of FIG. 5.

FIG. 7A is a graph illustrating a waveform produced by the quadrature voltage controlled oscillator of FIG. 4, and FIG. 7B is a graph illustrating a waveform produced by the quadrature voltage controlled oscillator of FIG. 5.

In FIG. 7A, a large swing waveform indicates the output voltages IP and IN from the VCO of FIG. 4 and a small swing waveform indicates the voltage at the node e of the VCO of FIG. 4. In FIG. 7B, a large swing waveform indicates the output voltages IP and IN of the VCO of FIG. 5 and a small swing waveform indicates the voltage at the node e of the VCO of FIG. 5. In FIGS. 7A and 7B, the vertical axis indicates a voltage and the horizontal axis indicates time.

Referring to FIGS. 7A and 7B, the VCO of FIG. 5 has a even better alignment between the minimum points of the output voltages IP and IN and the minimum point of the voltage at the node e, compared to the VCO of FIG. 4. Accordingly, it can be seen that the quadrature VCO of FIG. 5 has an excellent swing characteristic of the output voltages, compared to the quadrature VCO of FIG. 4.

While the negative resistance part and the coupling circuit part are composed of MOS transistors in the foregoing exemplary embodiments, they may be composed of other active devices, such as BJT transistors. Any type of LC circuit may be used in place of the above-described LC circuit as long as it has the minimum impedance at resonant frequency. Further, resonant frequency may be adjusted by electrical, mechanical, optical or thermal means other than the above-described varactor.

According to the present invention as described above, it is possible to provide in-phase signals and quadrature-phase signals having a low phase noise characteristic. It is also possible to provide in-phase signals and quadrature-phase signals having an excellent output swing characteristic.

The foregoing exemplary embodiment and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A quadrature voltage controlled oscillator comprising:

a first voltage controlled oscillator which outputs a positive in-phase output signal and a negative in-phase output signal;

a second voltage controlled oscillator which outputs a positive quadrature-phase output signal and a negative quadrature-phase output signal, the second voltage controlled oscillator having a symmetrical structure with the first voltage controlled oscillator and constituting a feedback loop together with the first voltage controlled oscillator;

a first constant current source which supplies constant current to the first voltage controlled oscillator in response to the output signals from one of the first and second voltage controlled oscillators; and a second constant current source which supplies constant current to the second voltage controlled oscillator in response to the output signals from one of the first and second voltage controlled oscillators, wherein the first constant current source is capable of supplying constant current to the first voltage controlled oscillator in response to at least the output signals from the first voltage controlled oscillator.

2. The oscillator as claimed in claim 1, wherein the first constant current source supplies the constant current in response to the positive in-phase output signal and the negative in-phase output signal.

3. The oscillator as claimed in claim 2, wherein the first constant current source comprises two NMOS transistors, and the positive in-phase output signal and the negative in-phase output signal are input to gates of the two NMOS transistors, respectively.

4. The oscillator as claimed in claim 1, wherein the second constant current source supplies the constant current in response to the positive quadrature-phase output signal and the negative quadrature-phase output signal.

5. The oscillator as claimed in claim 4, wherein the second constant current source comprises NMOS transistors, and the positive quadrature-phase output signal and the negative quadrature-phase output signal are input to gates of the two NMOS transistors, respectively.

6. The oscillator as claimed in claim 1, wherein the first current source supplies the constant current in response to the positive quadrature-phase output signal and the negative quadrature-phase output signal.

7. The oscillator as claimed in claim 6, wherein the first constant current source comprises two NMOS transistors, and the positive quadrature-phase output signal and the negative quadrature-phase output signal are input to gates of the two NMOS transistors, respectively.

8. The oscillator as claimed in claim 1, wherein the second constant current source supplies the constant current in response to the positive in-phase output signal and the negative in-phase output signal.

9. The oscillator as claimed in claim 8, wherein the second constant current source comprises NMOS transistors, and the positive in-phase output signal and the negative in-phase output signal are input to gates of the two NMOS transistors, respectively.

10. The oscillator as claimed in claim 1, wherein the first voltage controlled oscillator comprises a first negative resistance circuit, and the second voltage controlled oscillator comprises a second negative resistance circuit.

11. The oscillator as claimed in claim 10, wherein the first and second negative resistance circuits, each comprise two n-channel MOS transistors.

12. The oscillator as claimed in claim 10, wherein the first and second negative resistance circuits, each comprise two p-channel MOS transistors and two n-channel MOS transistors.

13. The oscillator as claimed in claim 3, wherein if a first transistor of the two NMOS transistors is turned off, a second transistor of the two NMOS transistors is turned on, and if the second transistor is turned off, the first transistor is turned on, thereby allowing constant current to be supplied to the first voltage controlled oscillator.

* * * * *